United States Patent
Donohue

(10) Patent No.: US 6,217,821 B1
(45) Date of Patent: Apr. 17, 2001

(54) METHOD OF FORMING DISTORTION-FREE CIRCUITS

(75) Inventor: Paul C. Donohue, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 09/324,276

(22) Filed: Jun. 2, 1999

(51) Int. Cl.[7] ........................................ C04B 37/00
(52) U.S. Cl. .................. 264/619; 156/89.16; 156/89.17; 156/89.18
(58) Field of Search ......................... 264/619; 156/89.16, 156/89.17, 89.18

(56) References Cited

U.S. PATENT DOCUMENTS

| | | | |
|---|---|---|---|
| 4,101,710 | 7/1978 | Sanford | 428/472 |
| 5,114,642 * | 5/1992 | Jung . | |
| 5,296,413 * | 3/1994 | Carroll et al. | 501/19 |
| 5,346,651 * | 9/1994 | Oprosky et al. | 252/514 |
| 5,782,945 | 7/1998 | Gavin | 65/60.1 |

* cited by examiner

Primary Examiner—Christopher A. Fiorilla

(57) ABSTRACT

A method of forming a distortion-free circuit whereby a conductive composition is applied to at least one layer of green ceramic tape. The conductive composition formulation is based on total composition, conductive powder selected from Ag, Pd, Pt and mixtures thereof and 0.5 to 1.5 wt. % boron; wherein a and b are dispersed in organic medium. The green tape formulation is, based on total composition, 25–50 wt. % glass composition comprising, based on mole %, 50–67% $B_2O_3$; 20–50% alkaline earth metal oxide; 2–15% rare earth oxide and 0–6% alkali metal oxide and 0–10% $Al_2O_3$; 50–75 wt. % refractory oxide and organic polymeric binder. The assemblage is fired to form a distortion-free circuit.

8 Claims, No Drawings

METHOD OF FORMING DISTORTION-FREE CIRCUITS

FIELD OF THE INVENTION

The invention is directed to a method of forming electrical circuitry in and on cofired ceramic tape by applying a thick film metallization composition comprising a boron component to at least one green sheet layer of the ceramic tape and firing the circuit to densify the ceramic, whereby the resulting circuit is distortion-free.

BACKGROUND OF THE INVENTION

In the fabrication of low temperature cofired ceramic circuits (LTCC), ceramic tape serves as the substrate and is cofired to densification with printed circuitry of thick film metallization. If the degree of shrinkage of the metallization is not closely matched to that of the ceramic, the circuit will distort or bow and become unusable. The problem is most severe when (1) the ceramic undergoes crystallization caused by the metallization promoting crystallization of the glasses in the ceramic tape and (2) shrinkage of the metallization composition is different from that of the ceramic tape.

There is a need for a thick film metallization which can be used to fabricate any circuit design and when cofired will result in an undistorted useful LTCC. The present invention utilizes a boron addition to a thick film metallization composition wherein the boron addition minimizes shrinkage of the metallization composition. Therefore, LTCC becomes distortion-free. The metallization compositions are generally known in the art and are described in U.S. Pat. No. 5,782,945 to Gavin, and U.S. Pat. No. 4,101,710 to Sanford and are incorporated herein by reference. Neither patent discloses the use of the composition on a ceramic tape and the shrinkage problem that such a match solves.

DETAILED DESCRIPTION OF THE INVENTION

The present invention is a method of forming electrical circuitry in and on cofired ceramic tape by applying a thick film metallization composition comprising conductive powders selected from the group Ag, Pd, Pt and mixtures thereof and 0.5 to 1.5% boron and 0–4% glass, based on total composition, to at least one green sheet layer of the ceramic tape forming a LTCC circuit and firing the circuit to densify the ceramic, whereby the resulting circuit is distortion-free.

Crystalline or amorphous or combinations thereof of elemental boron powder is added to conventional conductive thick film paste. Large ground planes of the paste may be printed on one side of green ceramic tape layers and after firing and densification, the circuit remains flat without distortion. Without the boron, the circuit will warp or bow usually with the paste layer shrinking less than the ceramic.

It is believed that the boron prevents the distortion by keeping the metal solids in the paste reduced, preventing formation of metal ions which interact with the glass in the ceramic tape to induce uneven shrinkage. The boron ultimately oxidizes to $B_2O_3$ at the higher temperature range of the firing cycle by reaction with air. A further feature of the invention is the addition of 0–4% of an additive to combine with the $B_2O_3$ to form a more stable structure within the conductor film. The preferred range of additive content is 0.5–2% based on the weight of paste. The additive prevents small beads of glass forming on the surface of the conductive layer. The additive could be an oxide which would react with the $B_2O_3$ or a metal which would oxidize to an oxide and react with the $B_2O_3$. For example, the oxide additives may include SiO2, Al2O3 or Cu2O. Elements which can oxidize to form an oxide include Cu, Ni, Fe, Co or Ti. The preferred is Cu. Although, the preferred additive is a non-crystallizing glass, in which the $B_2O_3$ would dissolve. The preferred glasses are borosilicates which do not contain modifying ions that may be reduced by boron, such reducible modifying ions would include Pb, Bi or Cd. The preferred borosilicates would contain modifying ions of alkali or alkaline earth elements such as Ca, Na or Li. A most preferred glass used in Glass #1 from the examples which is a borosilicate glass containing Li, Na and K modifying ions.

In addition to the non crystallizing glass additive, oxide powder additives may be added to the paste for the purpose of reacting with the $B_2O_3$ formed. A preferred additive is $SiO_2$ which may be in the amorphous or crystalline form. The preferred range of $SiO_2$ addition is 1–2% based on the weight of paste. Oxides such as $Al_2O_3$ and $ZrO_2$ have little effect and may increase bowing by increasing glass crystallization.

Generally, the thick film pastes for use in this invention are comprised of finely divided particles of metal particles which may be Ag, Pd, Pt, or mixtures thereof (referred to as "solids") dispersed in typical thick film medium, for example a cellulosic polmer dissolved in a terpineol type solvent.

The solids are mixed with an essentially inert liquid medium by mechanical mixing using a planetary mixer, then dispersed on a three roll mill to form a paste-like composition having suitable consistency and rheology for screen printing. The latter is printed as a "thick film" on a conventional crystallizable ceramic green tape in the convention manner.

Any essentially inert liquid may be used as the solvent. Examples of organic solvents which can be used are the aliphatic alcohols, esters of such alcohols, for example, acetates and propionate, terpenes such as pine oil, terpineol and the like, solutions of resins such as the polymethacrylates of lower alcohols, solutions of ethyl cellulose in solvents such as pine oil and the monobutyl ether of ethylene glycol monoacetate and dibutyl carbitol. A resin or combination thereof and a solvent or combinations thereof and various additives as those know in the art compose the organic medium. A preferred organic medium is based on a ethyl cellulose resin and a solvent mixture of alpha-, beta-, and gamma terpineols (generally 85–92% alpha-terpineol containing 8–15% beta- and gamma-terpineols). The organic medium may contain volatile liquids to promote fast setting after application to the substrate.

The ratio of organic medium to solids in the dispersions can vary considerably and depends upon the manner in which the dispersion is to be applied and the kind of solvent used. Normally to achieve good coverage, the dispersions will contain complementarily 50–95% solids and 50–5% organic medium, as described above. The compositions of the present invention may, of course, be modified by the addition of other materials which do not affect its beneficial characteristics. Such formulations are well within the state of the art.

The green ceramic tapes utilized in the invention are conventional tapes as those known in the industry. This would include tapes which contain (1) a crystallizable glass and filler or (2) totally crystallizable glasses with no filler. The preferred tape comprises a castable dielectric composition, based on solids: (a) 25–50 wt. % glass composition comprising based on mole %, 50–67% $B_2O_3$; 20–50% alkaline earth metal oxide; 2–15 rare earth oxide and further comprising, based on mole %, 0–6% alkali metal oxide and 0–10% $Al_2O_3$; (b) 50–75 wt. % refractory oxide; both dispersed in a solution of (c) an organic polymeric binder; and (d) a volatile organic solvent. The castable dielectric composition is used in a method of forming a low loss green tape by casting a thin layer of the dispersion onto a flexible substrate and heating the cast layer to remove the volatile organic solvent.

Within the compositional range of the above described tape, the most preferred solids composition for a green tape is: 45% of a glass composed of mole %: 28.57 CaO, 57.14 $B_2O_3$, 11.43 $La_2O_3$, 1.43 $Li_2O$ and 1.43 $Na_2O$; with 54.8% $Al_2O_3$ filler and 0.2% $Cu_2O$ added for coloring. To 100 g of solids, slip is prepared by addition of 24 g of an acrylic polymer solution of 30% polymer in ethylacetate solvent; 4.8 g of benzoflex plasticizer, 20 g of ethylacetate and 1 g of isopropanol additional solvent. On casting the tape, most of the solvent evaporates leaving the solids, polymer and plasticizer.

A further discussion of the preferred tape is found in U.S. patent application Ser. No. 09/012,296 entitled "Borate Glass based Ceramic Tape" as is herein incorporated by reference.

APPLICATION

The green tape is used primarily as a dielectric or insulating material for multilayer electronic circuits. A roll of green tape is blanked with registration holes in each corner to a size somewhat larger than the actual dimensions of the circuit. To contact various layers of the multilayer circuit, via holes are formed in the green tape. This is typically done by mechanical punching. However, a sharply focused laser can be used to volatilize the green tape. Typical via hole sizes range from 0.006" to 0.25". The interconnections between layers are formed by filling the via holes with a thick film conductive ink. This ink is usually applied by standard screen printing techniques. Each layer of circuitry is completed by screen printing conductor tracks. Also, resistor inks or high dielectric capacitor inks can be printed on each layer to form resistive or capacitive circuit(s) elements. Also, especially formulated high dielectric constant green tapes similar to those used in the multilayer capacitor industry can be incorporated as part of the multilayer circuitry.

After each layer of the circuit is completed, the individual layers are stacked and laminated. A confined pressing die is used to insure precise alignment between layers. The laminates are trimmed with a hot stage cutter. Firing is carried out in a standard thick film conveyor belt furnace or in a box furnace with a programmed heating cycle. A distortion-free circuit results from the process.

As used herein, the term "firing" means heating the assemblage in a oxidizing atmosphere such as air to a temperature and for a time sufficient to volatilize (burn-out) all of the organic material in the layers of the assemblage to sinter any glass, metal or dielectric material in the layers and thus densify the dielectric layer.

As used herein, "distortion-free" means that the shrinkage and camber of the ceramic is substantially unaffected by the presence of a screen printed metal layer, that is, a value of 0.03 inch or less in accordance to the test method below. A test to determine the degree of distortion measured in inches was devised wherein deviation from planarity was measured after firing of a 5 layer 1×1 build of ceramic tape having a metal layer printed to cover most of one side. Such a build is considered a worst case scenario because the ceramic and metal are imbalanced. Any difference in shrinkage will result in a warping of the 1×1 ceramic. If the ceramic and metal shrinkage are matched, the substrate will be flat. If the shrinkage is not matched, the substrate will warp or bow, usually in a direction in which the metal layer rises above the plane.

To measure the degree of distortion, a Mitutoyo digital thickness gauge was used. The substrate is placed on a flat stage and a probe is brought down on the substrate top. The thickness is recorded digitally. To measure distortion, the thickness is measured on both sides of the substrate. If there is no distortion, then the thickness is the same. If there is bowing, the thickness will be different and the degree can be determined by subtracting the thicknesses and reporting it as bowing. If there is no distortion, the difference (bowing) will be zero. This method was used to evaluate additives to metal pastes as described in the examples.

In commercial circuits, the metal within the layers will consist of fine lines, large area ground planes and vias connecting the layers. The distribution of these metallizations will be more or less balanced. In a balanced circuit the degree of distortion will not be as severe as the test. Thus, to be useful in a circuit, the degree of bowing as indicated in the worst case test build described above, may not necessarily be zero. Therefore, a range of usefulness can be defined as no greater than 0.03 inches depending on the circuit design.

It will be recognized by those skilled in the art that in each of the laminating steps the layers must be accurate in registration so that the vias are properly connected to the appropriate contact points of the adjacent functional layer.

The term "functional layer" refers to the layers printed on the ceramic green tape which have either conductive, resistive or capacitive functionality. Thus, as indicated above, a typical green tape layer may have printed thereon one or more resistor circuits and/or capacitors as well as a conductive circuit.

The present invention will be described in further detail by giving practical examples. The scope of the present invention, however, is not limited in any way by these practical examples.

EXAMPLES

This invention was demonstrated by preparing thick film pastes of silver metallization, printing the pastes to form a film covering most of the surface of a 1×1 five layer laminate of green sheets of ceramic tape of the preferred composition, firing the build in an oven to densify and measuring the degree of bowing of the resulting ceramic. The bowing results in a dome shape with the silver side rising above the plane of the 1×1. The degree of bow from planarity was measured in inches and in the examples is reported for ground planes on the top surface. The results were compared to a control paste of silver with glass and $B_2O_3$ addition alone.

Thick film pastes were prepared by mixing powders and organic printing vehicle. Compositions in Wt. %, based on total composition:

| Examples | 1 | 2 | 3 | 4 Comparative | 5 |
|---|---|---|---|---|---|
| Silver | 66.0 | 66.0 | 68.0 | 66.6 | 66.0 |
| Boron (crystalline) | 0.55 | — | — | — | — |
| Boron (amorphous) | — | 0.55 | 1.1 | — | — |
| Glass #1 | 3.3 | 3.3 | — | — | 3.0 |
| $B_2O_3$ | — | — | — | 4.4 | — |
| Organic vehicle | 30.1 | 30.1 | 31.9 | 28.9 | 30.1 |
| Bow of 1/1, inches | 0.007 | 0.000 | 0.000 | 0.076 | 0.073 |

| Example | 6 | 7 |
|---|---|---|
| Silver | 65.0 | 67.37 |
| Boron (amorphous) | — | 0.51 |
| Glass #2 | 3.0 | — |
| Glass #1 | — | 0.93 |
| $SiO_2$ (quartz form) | — | 1.83 |
| Organic vehicle | 32.0 | 29.36 |
| Bow of 1 × 1, in. | 0.059 | 0.00 |

Green ceramic tape used in these examples is the most preferred tape previously described, composed of a borate based glass and alumina filler. Tape of about 5 mils thick was laminated into 5 layer sheets, cut into 1×1s and the silver pastes were printed on top to form a film about 0.5 mils thick covering most of the surface. Alternatively, pastes were printed on single sheets of tape which were then dried and stacked with other layers to form buried metallized layers. The laminates were formed by pressing the stacked layers in die heated to 70° C. and pressured sufficiently to bond the green sheets (about 3000 psi) The builds were fired in a box furnace to a peak temperature of 850° C. The resulting ceramic shrank about 10% and showed varying degrees of bowing from planarity which was measured in inches.

The examples show that the addition of boron, either crystalline or amorphous, decreases the bowing to zero. Example 6 uses a commercial paste developed to eliminate bowing in commercial tape. The addition of $B_2O_3$ in Example 4 shows high degree of bow indicating that the effect is not due to the interaction of $B_2O_3$ formed by oxidation of boron. Example 5 shows the effect of glass addition without the boron. Example 7 shows the use of an additional filler of $SiO_2$ (quartz form).

The following examples show the use of $Cu_2O$ and copper powder.

Pastes were prepared with the following formulations, based on total composition:

| Examples | 8 wt % | 9 wt % |
|---|---|---|
| Silver | 69.93 | 68.72 |
| Boron (amorphous) | 0.69 | 0.69 |
| $Cu_2O$ | 1.17 | — |
| Copper powder | — | 1.15 |
| Organic Vehicle | 28.21 | 29.44 |

1 × 1 ground planes were prepared as described, printed on top of a 5 layer tape build and fired to densification. Bowing was measured:

| Examples | 8 wt % | 9 wt % |
|---|---|---|
| Top ground plane Bow, in. | 0.003 | 0.005 |

| GLOSSARY | |
|---|---|
| Silver | Ag powder 2.3 μm ave. particle size, irregular shaped |
| Boron (crystalline) | made by Alpha Johnson Mattey, catalog #00440 |
| Boron (amorphous) | made by Johnson Mattey, catalog #11337 |
| Glass #1 | 72% $SiO_2$, 25% $B_2O_3$, 1% $Al_2O_3$, 0.5% $Li_2O$, 0.5% $Na_2O$, 1% $K_2O$ |
| Commercial Glass #2* | 56.5% $SiO_2$, 17.2% PbO, 4.5% $B_2O_3$, 9.1% $Al_2O_3$, 8.6% CaO, 2.4% $Na_2O$ and 1.7% $K_2O$ |
| $B_2O_3$ | made by Alpha Johnson Maffey, catalog #89964 |
| Organic vehicle | ethyl cellulose in terpineol |

I claim:

1. A method of forming a distortion-free circuit comprising the following steps:

A. applying a conductive composition to at least one layer of green ceramic tape forming an assemblage wherein the conductive composition comprises, based on total composition:

(a) conductive powder selected from Ag, Pd, Pt and mixtures thereof; and (b) 0.5 to 1.5 wt. % boron; wherein a and b are dispersed in organic medium; and wherein the ceramic green tape comprises, based on total composition: (a) 25–50 wt. % glass composition comprising, based on mole %, 50–67% $B_2O_3$; 20–50% alkaline earth metal oxide; 2–15% rare earth oxide and 0–6% alkali metal oxide and 0–10% $Al_2O_3$; (b) 50–75 wt. % refractory oxide and (c) organic polymer binder; and B. firing the assemblage to form a distortion-free circuit.

2. The method of claim 1 wherein the conductive composition further comprises no greater than 4 wt. % of an additive, based on total composition.

3. The method of claim 2 wherein the additive is no greater than 2 wt. %.

4. The method of claim 2 wherein the additive is a non-crystallizing glass.

5. The method of claim 4 wherein the non-crystallizing glass is a borosilicate glass containing modifying ions of alkali or alkaline earth elements or mixtures thereof.

6. The method of claim 2 wherein the additive is an oxide of copper.

7. The method of claim 2 wherein the additive is a copper powder.

8. The method of claim 2 wherein the additive is $SiO_2$.

* * * * *